United States Patent
Yu et al.

(10) Patent No.: US 10,088,379 B2
(45) Date of Patent: Oct. 2, 2018

(54) DATA TRANSMITTING DEVICE CAPABLE OF CONFIGURING DIFFERENT OPERATING FREQUENCIES FOR USE BY TIRE PRESSURE MONITORING DETECTOR

(71) Applicant: CUB ELECPARTS INC., Fuxing Township, Changhua County (TW)

(72) Inventors: San-Chuan Yu, Fuxing Township, Changhua County (TW); Tsan-Nung Wang, Fuxing Township, Changhua County (TW); Chao-Ching Hu, Fuxing Township, Changhua County (TW); Chi-Hung Chen, Fuxing Township, Changhua County (TW); Wei-Hung Ma, Fuxing Township, Changhua County (TW)

(73) Assignee: CUB ELECPARTS INC., Changhua County (TW)

( * ) Notice: Subject to any disclaimer, the term of this patent is extended or adjusted under 35 U.S.C. 154(b) by 140 days.

(21) Appl. No.: 15/353,124

(22) Filed: Nov. 16, 2016

(65) Prior Publication Data
US 2018/0094996 A1  Apr. 5, 2018

(30) Foreign Application Priority Data
Sep. 30, 2016  (TW) .............................. 105131726 A

(51) Int. Cl.
*B60C 23/02* (2006.01)
*G01L 17/00* (2006.01)
(Continued)

(52) U.S. Cl.
CPC .......... *G01L 17/00* (2013.01); *B60C 23/0452* (2013.01); *B60C 23/0455* (2013.01);
(Continued)

(58) Field of Classification Search
None
See application file for complete search history.

(56) References Cited

U.S. PATENT DOCUMENTS 5,541,574 A * 7/1996 Lowe .................. B60C 23/0408
340/442
5,673,018 A * 9/1997 Lowe .................. B60C 23/0408
235/384
(Continued)

*Primary Examiner* — Andre Allen
(74) *Attorney, Agent, or Firm* — Muncy, Geissler, Olds & Lowe, P.C.

(57) ABSTRACT

A data transmitting device capable of configuring different operating frequencies for use by a tire pressure monitoring detector includes: a standard oscillator; a phase locked loop including a phase frequency comparator, a filter, and a pressure-controlling oscillator; a microcontrol unit electrically connected to the standard oscillator and the phase frequency comparator and adapted to store a first ratio and a second ratio; and a signal output unit electrically connected to the output end of the pressure-controlling oscillator and the microcontrol unit. The microcontrol unit allows a user to select and send the first or second ratio to the phase frequency comparator. The phase locked loop generates a target frequency signal according to the first or second ratio selected by the user. The microcontrol unit sends a data to the signal output unit, and the signal output unit outputs the data according to the frequency of the target frequency signal.

5 Claims, 3 Drawing Sheets

(51) Int. Cl.
*H03L 7/099* (2006.01)
*B60C 23/04* (2006.01)
*H04B 1/04* (2006.01)

(52) U.S. Cl.
CPC .......... *B60C 23/0462* (2013.01); *H03L 7/099* (2013.01); *H04B 1/0458* (2013.01)

(56) References Cited

U.S. PATENT DOCUMENTS

| | | | | |
|---|---|---|---|---|
| 6,469,621 | B1* | 10/2002 | Vredevoogd | B60C 23/0408 340/442 |
| 6,609,419 | B1* | 8/2003 | Bankart | B60C 23/0428 200/61.22 |
| 2010/0141416 | A1* | 6/2010 | Kukshya | B60C 23/0408 340/447 |
| 2017/0097279 | A1* | 4/2017 | Maki | G01M 5/0066 |
| 2017/0326926 | A1* | 11/2017 | So | B60C 23/02 |

* cited by examiner

DATA TRANSMITTING DEVICE CAPABLE OF CONFIGURING DIFFERENT OPERATING FREQUENCIES FOR USE BY TIRE PRESSURE MONITORING DETECTOR

BACKGROUND OF THE INVENTION

Field of the Invention

The present invention relates to data transmitting devices and, more particularly, to a data transmitting device capable of configuring different operating frequencies for use by a tire pressure monitoring detector.

Description of the Prior Art

Depending on specifications, conventional tire pressure monitoring detectors come in two categories: those operating at a frequency of 315 MHz, and those operating at a frequency of 433.92 MHz. The aforesaid two frequencies are intended to match the receiving frequencies of vehicular host computers, respectively, because tire pressure monitoring detectors operating at 315 MHz are inapplicable to vehicular host computers operating at 433.92 MHz, and vice versa. In view of this, if a tire pressure monitoring detector were capable of selecting its operating frequency and thus applicable to different types of vehicular host computers, the tire pressure monitoring detector would be popular with consumers.

US 2014/0306815 A1 discloses a multi-frequency tire pressure monitoring detector which uses a phase locked loop (PLL) 270 to adjust frequencies, as shown in FIG. 2, and uses a microcontroller to provide a related control function. The PLL 270 generates signals of a predetermined frequency each under the control of the microcontroller 250, and then the signals are sent to two RF matching circuits 220, 225 at the back end according to their frequencies, respectively. Afterward, the matched circuit sends the signals to an antenna 230 whereby the signals are sent out wirelessly. FIG. 3 of US 2014/0306815 A1 shows the fine structures disposed between the PLL and the two matching circuits. Paragraphs [0026]~[0029] in the specification of US 2014/0306815 A1 disclose an operating technique of selecting a frequency of 315 MHz and a frequency of 433.92 MHz and selecting a matching circuit. Paragraph [0029] in the specification of US 2014/0306815 A1 discloses using a programmable logic function 330 to open or close a first switch 335 or a second switch 340, so as to select a matching circuit.

The aforesaid prior art involves using a PLL to provide a frequency of 315 MHz and a frequency of 433.92 MHz for a user to select therebetween. However, the aforesaid two frequencies are achieved not only with the pressure-controlling oscillator of the PLL, but also with two oscillators 310, 350 (shown in FIG. 3) by frequency multiplication. The aforesaid technique, which is based on the use of two oscillators, incurs high costs and requires advanced technology. Furthermore, data of the microcontroller of US 2014/0306815 A1 is transmitted with the PLL and the matching circuit; as a result, not only are data transmission-related components and routes intricate, but the data transmission is also susceptible to interference.

SUMMARY OF THE INVENTION

It is an objective of the present invention to provide a data transmitting device capable of configuring different operating frequencies for use by a tire pressure monitoring detector, using, in addition to the pressure-controlling oscillator of a PLL, only one oscillator to configure different operating frequencies, thereby lowering costs and technological hurdles.

Another objective of the present invention is to provide a data transmitting device capable of configuring different operating frequencies for use by a tire pressure monitoring detector such that its data is sent directly from a microcontrol unit to a signal output unit for outward transmission but is not sent through a phase locked loop.

In order to achieve the above and other objectives, the present invention provides a data transmitting device capable of configuring different operating frequencies for use by a tire pressure monitoring detector, comprising: a standard oscillator for providing an oscillation signal of a fixed frequency and using the fixed frequency as a standard frequency; a phase locked loop comprising a phase frequency comparator, a filter, and a pressure-controlling oscillator, with the phase frequency comparator being electrically connected to the standard oscillator, the filter being electrically connected to the phase frequency comparator, and the pressure-controlling oscillator being electrically connected to the filter, wherein the pressure-controlling oscillator has an output end electrically connected to the phase frequency comparator; a microcontrol unit electrically connected to the standard oscillator and the phase frequency comparator and adapted to store a first ratio and a second ratio; and a signal output unit electrically connected to the output end of the pressure-controlling oscillator and the microcontrol unit, wherein the microcontrol unit allows a user to select the first ratio or the second ratio and sends the first ratio or the second ratio selected by the user to the phase frequency comparator, wherein the phase locked loop receives an oscillation signal from the standard oscillator, generates a target frequency signal according to the first ratio or the second ratio selected by the user, and sends the target frequency signal from the output end to the phase frequency comparator and the signal output unit, wherein the microcontrol unit sends a data to the signal output unit, and the signal output unit outputs the data according to the frequency of the target frequency signal.

Therefore, the present invention enables a user to determine the operating frequency of a tire pressure monitoring detector and thus match the tire pressure monitoring detector and different vehicular host computers, thereby allowing the tire pressure monitoring detector to be applicable to vehicular host computers of different specifications. Furthermore, in addition to the pressure-controlling oscillator of a phase locked loop, the present invention uses only one standard oscillator to configure different operating frequencies, thereby cutting costs. Another advantage of the present invention is the lowering of technological hurdles by sparing the need to coordinate two oscillators operating at different frequencies.

BRIEF DESCRIPTION OF THE DRAWINGS

Technical features of the present invention are hereunder illustrated with preferred embodiments in conjunction with the accompanying drawings, in which.

DETAILED DESCRIPTION OF THE EMBODIMENT OF THE INVENTION

Figure 1:
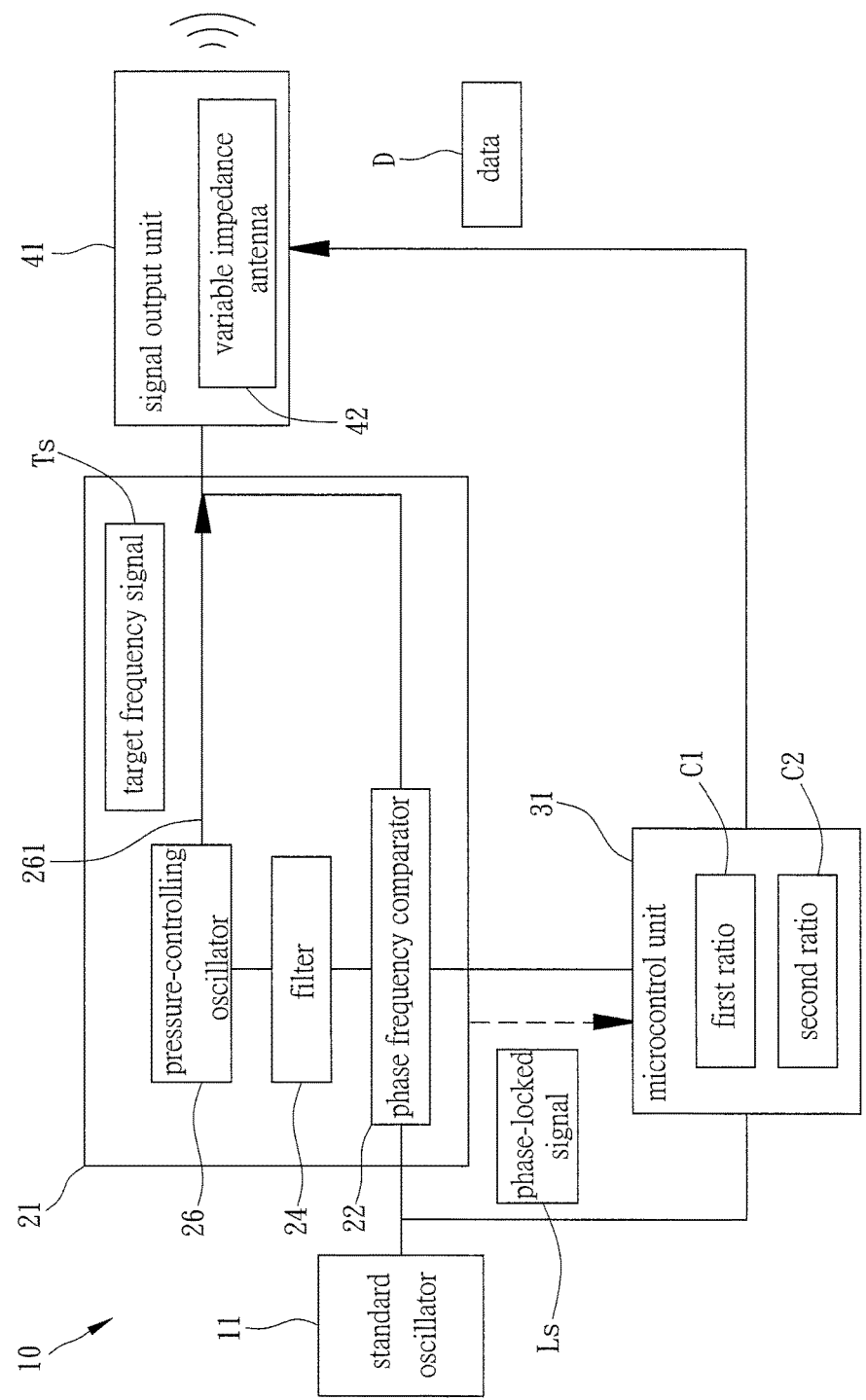
FIG. 1 is a block diagram of the first preferred embodiment of the present invention.

Referring to FIG. 1, a preferred embodiment of the present invention provides a data transmitting device 10 capable of configuring different operating frequencies for use by a tire pressure monitoring detector, essentially comprising a standard oscillator 11, a phase locked loop 21, a microcontrol unit 31, and a signal output unit 41.

The standard oscillator 11 provides an oscillation signal of a fixed frequency and uses the fixed frequency as a standard frequency.

The phase locked loop (PLL) 21 comprises a phase frequency comparator 22, a filter 24, and a pressure-controlling oscillator 26. The phase frequency comparator 22 is electrically connected to the standard oscillator 11. The filter 24 is electrically connected to the phase frequency comparator 22. The pressure-controlling oscillator 26 is electrically connected to the filter 24. The pressure-controlling oscillator 26 has an output end 261 which is electrically connected to the phase frequency comparator 22.

The microcontrol unit 31 is electrically connected to the standard oscillator 11 and the phase frequency comparator 22. The microcontrol unit 31 stores a first ratio Cl and a second ratio C2.

The signal output unit 41 is electrically connected to the output end 261 of the pressure-controlling oscillator 26 and the microcontrol unit 31.

The microcontrol unit 31 allows a user to select the first ratio C1 or the second ratio C2. The microcontrol unit 31 sends the first ratio C1 or the second ratio C2 selected by the user to the phase frequency comparator 22. If the user selects the first ratio C1, it means the user wants to set the operating frequency to 315 MHz. If the user selects the second ratio C2, it means the user wants to set the operating frequency to 433.92 MHz. Before the user selects the first ratio C1 or the second ratio C2, the microcontrol unit 31 uses the first ratio C1 as the default ratio.

The phase locked loop 21 receives an oscillation signal from the standard oscillator 11, generates a target frequency signal Ts according to the first ratio C1 or the second ratio C2 selected by the user, and sends the target frequency signal Ts from the output end 261 to the phase frequency comparator 22 and the signal output unit 41.

The microcontrol unit 31 sends a data D to the signal output unit 41. The signal output unit 41 outputs the data D according to the frequency of the target frequency signal Ts.

In practice, the standard oscillator 11 is a single component independent of the microcontrol unit 31 or an oscillation component integrated into the microcontrol unit 31.

In practice, after the phase locked loop 21 has entered a phase-locked state, the phase frequency comparator 22 sends a phase-locked signal Ls to the microcontrol unit 31, so as to determine whether the target frequency signal Ts generated from the phase locked loop 21 has achieved the required frequency. However, if the phase frequency comparator 22 does not send the phase-locked signal Ls to the microcontrol unit 31, it will still be feasible to wait for a specific period of time (generally around 50 milliseconds) before the phase locked loop 21 enters the phase-locked state.

The signal output unit 41 outputs the data D outward according to the frequency of the target frequency signal Ts, and the recipient is another wireless transmitting device. In practice, it is also feasible for the signal output unit 41 not to output the data D to another wireless transmitting device; instead, the signal output unit 41 further has a variable impedance antenna 42 whose impedance is adjusted to match the frequency of the target frequency signal Ts, allowing the data D to be wirelessly transmitted outward through the variable impedance antenna 42 at the frequency.

The framework of the present invention is described above. The operation state of the present invention is described below.

Figure 2:
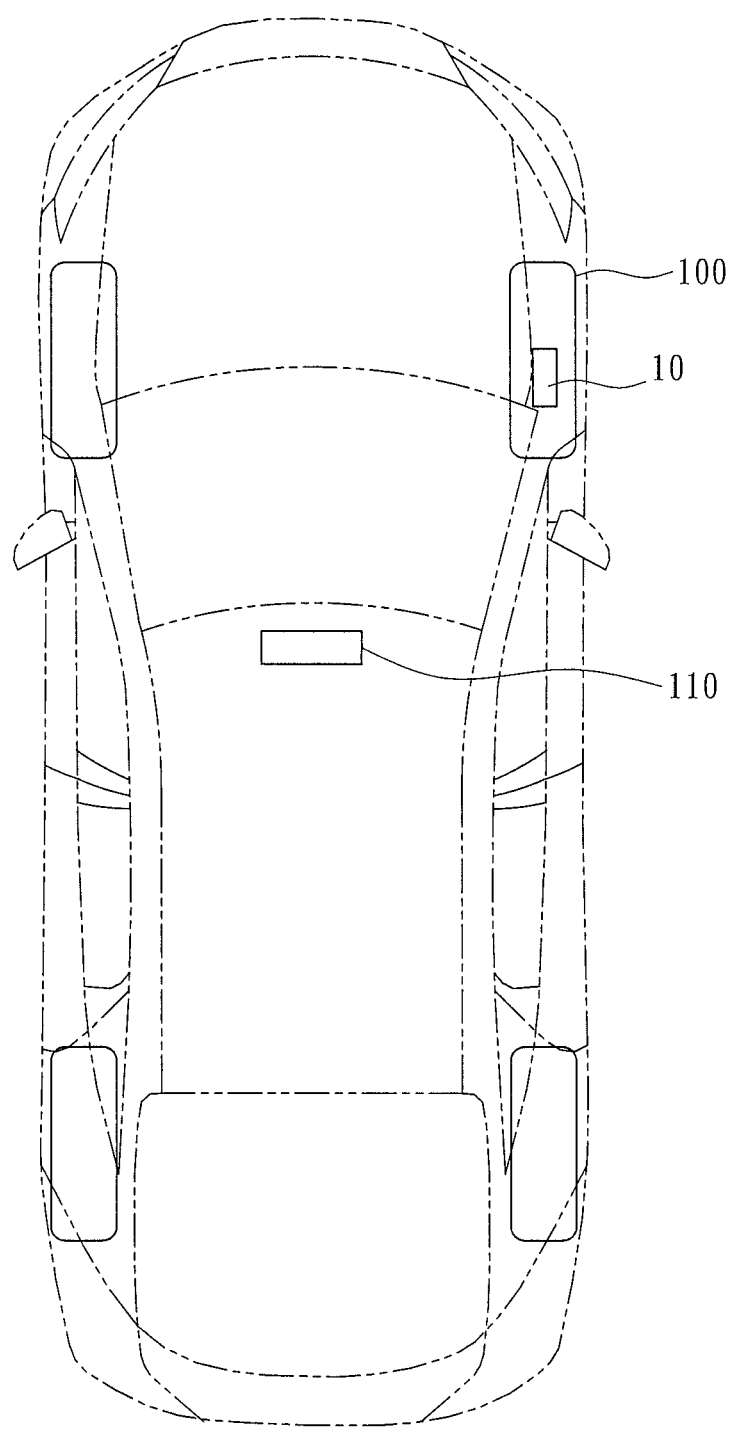
FIG. 2 is a schematic view of how to operate the first preferred embodiment of the present invention in one aspect.

Referring to FIG. 1, since the first and second ratios C1, C2 are indicative of the user's preference to set the operating frequency to 315 MHz and 433.92 MHz, respectively, to set the operating frequency to 315 MHz, the user either uses the microcontrol unit 31 to select the first ratio C1 or allows the microcontrol unit 31 to use the first ratio C1 as the default ratio, and then the microcontrol unit 31 sends the first ratio C1 to the phase frequency comparator 22. At this point in time, the phase locked loop 21 starts to operate according to the first ratio C1 and eventually enters the phase-locked state, whereas the target frequency signal Ts output from the output end 261 of the pressure-controlling oscillator 26 indicates a frequency of 315 MHz. After the phase locked loop 21 has entered the phase-locked state, the microcontrol unit 31 sends the data D to the signal output unit 41, allowing the signal output unit 41 to output the data D outward at a frequency of 315 MHz. When the signal output unit 41 has the variable impedance antenna 42, the impedance of the variable impedance antenna 42 can be adjusted to therefore match a frequency of 315 MHz, allowing the data D to be wirelessly output outward. Therefore, as shown in FIG. 2, the tire pressure monitoring detector 100 operates at a frequency of 315 MHz and sends the tire pressure status to a vehicular host computer 110, effectuating tire pressure monitoring.

Figure 3:
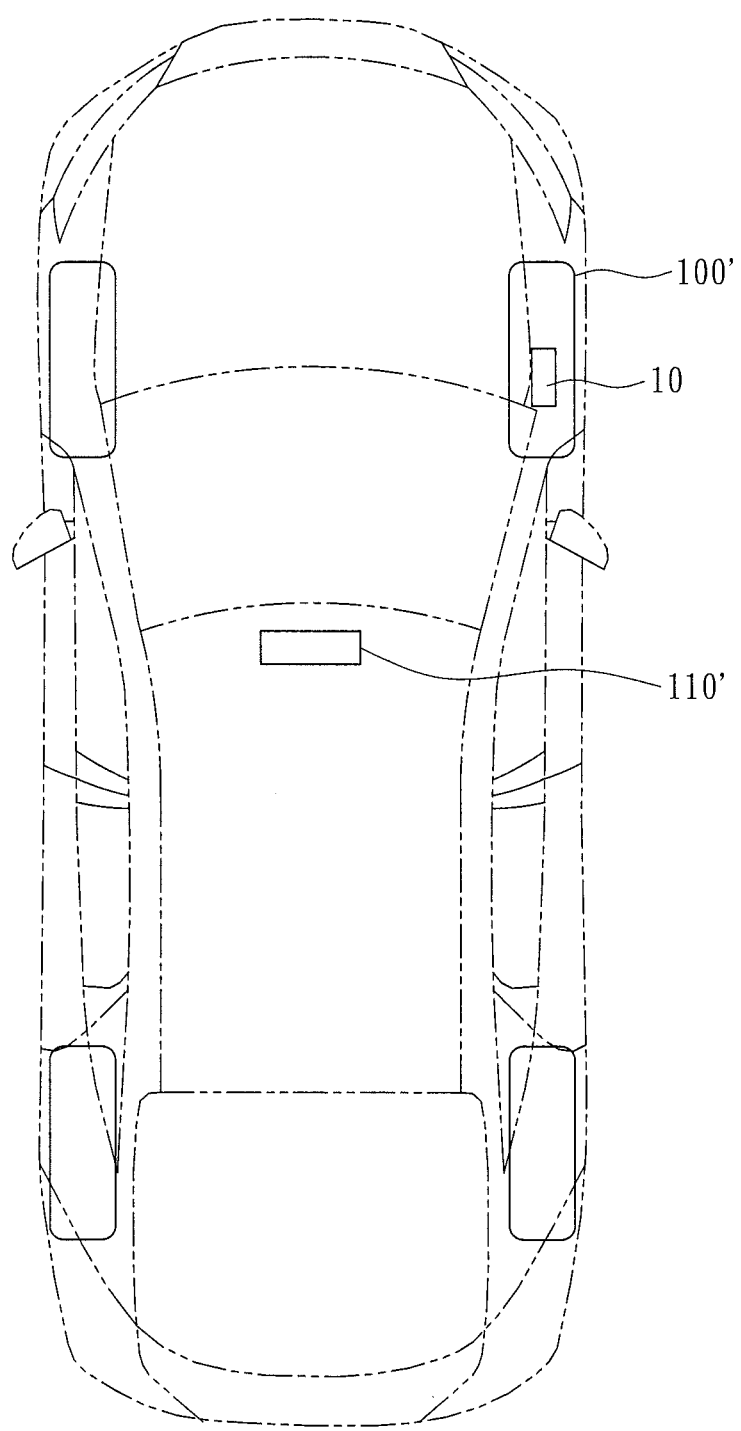
FIG. 3 is a schematic view of how to operate the first preferred embodiment of the present invention in another aspect.

To select an operating frequency of 433.92 MHz, the user uses the microcontrol unit 31 to select and send the second ratio C2 to the phase frequency comparator 22 such that the phase locked loop 21 starts to operate according to the second ratio C2 and eventually enters the phase-locked state, and in consequence the target frequency signal Ts output from the output end 261 of the pressure-controlling oscillator 26 indicates a frequency of 433.92 MHz. After the phase locked loop 21 has entered the phase-locked state, the microcontrol unit 31 sends the data D to the signal output unit 41, and therefore the signal output unit 41 outputs the data D outward at a frequency of 433.92 MHz. When the signal output unit 41 has the variable impedance antenna 42, the impedance of the variable impedance antenna 42 can be adjusted to therefore match a frequency of 433.92 MHz, allowing the data D to be wirelessly output outward. Therefore, as shown in FIG. 3, the tire pressure monitoring detector 100' operates at a frequency of 433.92 MHz and sends the tire pressure status to a vehicular host computer 110', effectuating tire pressure monitoring.

Therefore, the technology provided by the present invention enables the user to determine the operating frequency of the tire pressure monitoring detector, thereby allowing the tire pressure monitoring detector to be applicable to vehicular host computers of different specifications.

Unlike the prior art, the present invention is characterized in that, in addition to the pressure-controlling oscillator 26 of the phase locked loop 21, the present invention uses only one standard oscillator 11 to configure different operating frequencies, thereby cutting costs and lowering technological hurdles by sparing the need to coordinate two oscillators operating at different frequencies.

The data D is directly provided by the microcontrol unit 31 to the signal output unit 41 and output outward therefrom rather than through the phase locked loop 21; hence, the transmission of the data D is insusceptible to interference and efficient.

According to the present invention, in the situation where the user selects different operating frequencies, the target frequency signal Ts is always output from the output end 261. By contrast, US 2014/0306815 A1 discloses sending signals of different frequencies with different channels. Therefore, the present invention is distinguished from the prior art.

What is claimed is:

1. A data transmitting device capable of configuring different operating frequencies for use by a tire pressure monitoring detector, comprising:
    a standard oscillator for providing an oscillation signal of a fixed frequency and using the fixed frequency as a standard frequency;
    a phase locked loop comprising a phase frequency comparator, a filter, and a pressure-controlling oscillator, with the phase frequency comparator being electrically connected to the standard oscillator, the filter being electrically connected to the phase frequency comparator, and the pressure-controlling oscillator being electrically connected to the filter, wherein the pressure-controlling oscillator has an output end electrically connected to the phase frequency comparator;
    a microcontrol unit electrically connected to the standard oscillator and the phase frequency comparator and adapted to store a first ratio and a second ratio; and
    a signal output unit electrically connected to the output end of the pressure-controlling oscillator and the microcontrol unit,
    wherein the microcontrol unit allows a user to select the first ratio or the second ratio and sends the first ratio or the second ratio selected by the user to the phase frequency comparator,
    wherein the phase locked loop receives an oscillation signal from the standard oscillator, generates a target frequency signal according to the first ratio or the second ratio selected by the user, and sends the target frequency signal from the output end to the phase frequency comparator and the signal output unit,
    wherein the microcontrol unit sends a data to the signal output unit, and the signal output unit outputs the data according to the frequency of the target frequency signal.

2. The data transmitting device capable of configuring different operating frequencies for use by a tire pressure monitoring detector according to claim 1, wherein, after the phase locked loop has entered a phase-locked state, the phase frequency comparator sends a phase-locked signal to the microcontrol unit.

3. The data transmitting device capable of configuring different operating frequencies for use by a tire pressure monitoring detector according to claim 1, wherein the standard oscillator is integrated into the microcontrol unit.

4. The data transmitting device capable of configuring different operating frequencies for use by a tire pressure monitoring detector according to claim 1, wherein the signal output unit further has a variable impedance antenna and adjusts impedance of the variable impedance antenna according to frequency of the target frequency signal sent from the output end of the pressure-controlling oscillator, so as to match the frequencies, thereby sending out wirelessly the data through the variable impedance antenna according to the frequencies.

5. The data transmitting device capable of configuring different operating frequencies for use by a tire pressure monitoring detector according to claim 1, wherein the microcontrol unit uses the first ratio as a default ratio.

\* \* \* \* \*